US010438772B2

(12) United States Patent
Varadan et al.

(10) Patent No.: US 10,438,772 B2
(45) Date of Patent: Oct. 8, 2019

(54) METHODS AND APPARATUS FOR HIGH THROUGHPUT SEM AND AFM FOR CHARACTERIZATION OF NANOSTRUCTURED SURFACES

(71) Applicant: NANOWEAR INC., Brooklyn, NY (US)

(72) Inventors: Vijay Varadan, State College, PA (US); Pratyush Rai, State College, PA (US); Gyanesh Mathur, State College, PA (US)

(73) Assignee: NANOWEAR INC., Brooklyn, NY (US)

( * ) Notice: Subject to any disclaimer, the term of this patent is extended or adjusted under 35 U.S.C. 154(b) by 0 days.

(21) Appl. No.: 15/974,176

(22) Filed: May 8, 2018

(65) Prior Publication Data

US 2018/0330918 A1  Nov. 15, 2018

Related U.S. Application Data

(60) Provisional application No. 62/502,849, filed on May 8, 2017.

(51) Int. Cl.
*H01J 37/28* (2006.01)
*H01J 37/20* (2006.01)
(Continued)

(52) U.S. Cl.
CPC .............. *H01J 37/28* (2013.01); *G01Q 30/02* (2013.01); *G01Q 30/04* (2013.01); *H01J 37/20* (2013.01); *B82Y 35/00* (2013.01); *G01Q 60/30* (2013.01); *G01Q 60/42* (2013.01); *H01J 2237/2803* (2013.01); *H01J 2237/2814* (2013.01)

(58) Field of Classification Search
CPC .... H01J 37/28; H01J 37/20; H01J 2237/2803; H01J 2237/2814; G01Q 30/02; G01Q 30/04; G01Q 60/30; G01Q 60/42; B82Y 35/00
USPC .............. 250/440.11, 441.11, 442.11, 443.1; 850/1, 2, 3, 5, 7, 21, 22, 23
See application file for complete search history.

(56) References Cited

U.S. PATENT DOCUMENTS

| 2002/0054663 A1* | 5/2002 | Olson .................... G01N 23/20 378/79 |
| 2005/0208304 A1* | 9/2005 | Collier ................... B01J 23/745 428/403 |

(Continued)

*Primary Examiner* — Nicole M Ippolito
(74) *Attorney, Agent, or Firm* — Davidson, Davidson & Kappel, LLC

(57) ABSTRACT

A system and method is provided for of characterizing nanostructured surfaces. A nanostructure sample is placed in an SEM chamber and imaged. The system and method locates one of the nanostructures using images from the SEM imaging, excises a top portion of the nanostructure, places said top portion on a substrate such that the nanostructures are perpendicular to the substrate and a base of the top portion contacts the substrate, performs high energy ion beam assisted deposition of metal at the base to attach the top portion to the substrate, SEM imaging the top portions in the SEM chamber, determining coordinates of the top portions relative to the substrate from the SEM imaging of the top portions, placing the substrate in an AFM chamber, and performing AFM imaging of the top portions using the coordinates previously determined.

16 Claims, 10 Drawing Sheets

(51) Int. Cl.
  *G01Q 60/42*  (2010.01)
  *G01Q 30/02*  (2010.01)
  *G01Q 30/04*  (2010.01)
  *B82Y 35/00*  (2011.01)
  *G01Q 60/30*  (2010.01)

(56) References Cited

U.S. PATENT DOCUMENTS

| | | |
|---|---|---|
| 2016/0222539 A1 | 8/2016 | Varadan et al. |
| 2017/0226643 A1 | 8/2017 | Varadan et al. |
| 2017/0315109 A1* | 11/2017 | Alden ............... G01N 33/54366 |
| 2018/0028081 A1* | 2/2018 | Suk ...................... A61B 5/0071 |
| 2018/0080126 A9 | 3/2018 | Varadan et al. |
| 2018/0178227 A1* | 6/2018 | Fedorov .................... B05B 5/16 |

* cited by examiner

METHODS AND APPARATUS FOR HIGH THROUGHPUT SEM AND AFM FOR CHARACTERIZATION OF NANOSTRUCTURED SURFACES

This application claims priority to U.S. Provisional Application Ser. No. 62/502,849, filed May 8, 2017, entitled Methods and Apparatus for High Throughput SEM and AFM for Characterization of Nanostructured Surfaces, the entire disclosure of which is hereby incorporated by reference.

FIELD OF INVENTION

The present invention relates to the field of methods and apparatus used in Scanning Electron Microscopy (SEM) and Atomic Force Microscopy (AFM) for measuring the dimensions, size distribution, physical and chemical properties of samples.

BACKGROUND

Vertically free standing nanostructures, because of their large surface area and their adaptability to different surface chemistries, are increasingly being used to improve the performance of bioimpedance and biopotential based medical devices, solar energy conversion, thermoelectric devices, super capacitors, quantum wires, optoelectronic devices, fuel cells, and lithium-ion based batteries.

The fabrication process of nanosensors, such as roll to roll printing, screen printing, cleanroom thin-film fabrication technology, template assisted growth of vertically standing nanostructures, require quality checks for consistent results. Measurement of nanoparticles/nanostructures that are part of the surface, nanocomposite or coatings of the nanosensor is important for application specific nanosensor properties.

Scanning Electron Microscopy (SEM) and Atomic Force Microscopy (AFM) techniques are the main tools of nanoparticles/nanostructure metrology. The measurement involves analysis of many representative samples of the nanosensor product, taken from the process line, in order to ensure consistency of nanosensor properties. But the current AFM and SEM techniques lack automation and limitations in the known AFM techniques in scanning vertical structures with high aspect ratio prevents them from being used for fast and accurate analysis of vertically free standing nanostructures which are made of materials with different moduli of elasticity, e.g., from rigid metals and metal oxides to soft polymers.

Complete nanoparticle/nanostructure measurement and analysis involve size distribution measurements (using SEM), interior structure measurements (using Tunneling Electron Microscopy), elemental analysis (using SEM-Energy Dispersive X-ray spectroscopy), surface roughness measurements (using AFM), nanostructure dimension measurements (using AFM), mechanical strength measurements (using AFM), as well as electrical, electromagnetic, and chemical property analysis (using AFM). Conventional AFM and SEM face challenges especially in case of free standing nanostructures. The free standing nanostructures with high aspect ratio, which may be rigid or flexible, are difficult to scan at the tip because they are susceptible to movement/vibration and may have different tilt, i.e. not all of the tips face up with 0° incline/tilt.

With few exceptions such as Atomic Force Scanning Electron Microscopy Systems (AFSEMS) from Semilabsinc. and Agar Scientific, SEM and AFM are done separately. Since they are done separately, there is no way to collate SEM and AFM of the same nanostructures over a large number of nanostructures on a surface.

Atomic Force Scanning Electron Microscopy Systems (AFSEMS) have an AFM stage mounted within the SEM chamber to enable simultaneous scanning. However, while this provides an AFM combined with SEM, it still does not solve limitation of AFM in case of scanning vertical structures with high aspect ratio and it limits AFM applications to dry sample scanning only. Wet SEM technology such as QuantomiX WETSEM, uses a capsule to keep the wet sample within, thus not allowing for an AFM probe to reach the sample. Further, the SEM chamber limits the AFM in measurement of conductivity, electromagnetic testing of the nanostructure and limits AFM methods to study mechanical properties of nanostructures. Performing SEM and AFM separately on large number of samples is a cumbersome task and is prone to errors because of the manual processes involved in moving and preparing the samples.

SUMMARY OF INVENTION

In accordance with an embodiment of the present invention, a system and method is provided for of characterizing nanostructured surfaces. A sample including a plurality of nanostructures is placed in an SEM chamber. The SEM images the sample in the SEM chamber, and for each of a plurality of selected nanostructures, the system and method (1) locates one of the selected nanostructures using images from the SEM imaging, excises a top portion of predetermined length of said one of nanostructures while holding the portion with a probe, (3) places said top portion on a substrate such that the nanostructure are perpendicular to the substrate and a base of the top portion contacts the substrate, and (4) performs high energy ion beam assisted deposition of metal at the base to attach the top portion to the substrate. The SEM then images the top portions in the SEM chamber, and coordinates of the top portions are determined relative to the substrate from the SEM imaging of the top portions. The substrate is then placed in an AFM chamber, and the AFM performs AFM imaging of the top portions using the coordinates previously determined. Then, the coordinates are used to overlay an AFM image from the AFM imaging of the top portion on an SEM image of the SEM imaging of the top portion to an overlaid image.

In according with a variant of the embodiment described above, a tip/tilt kinematic platform is provided in the SEM including a detachable perfectly smooth platform for accommodating at least 2 samples with at least one of them being a smooth substrate, stilts that move up and down with nanometer precision using a first motor, stilts that move laterally with nanometer precision using a second motor. Further, a precision suction probe is preferably provided including a micro suction nozzle, third, fourth and fifth motors for controlling pitch, yaw and roll of the micro suction nozzle, and further motors for extending micro suction nozzle and moving it sideways along one edge of the tip/tilt kinematic platform, a miniature vacuum pump, and electronically controlled valve to control vacuum suction. In accordance with further aspects of this embodiment, one or more controllers are provided for controlling movement of the stepper motors with a SEM image feedback loop in order to excise the top portion from the sample and place the top portion on the substrate.

DETAILED DESCRIPTION OF THE EMBODIMENTS

Figure 1A:
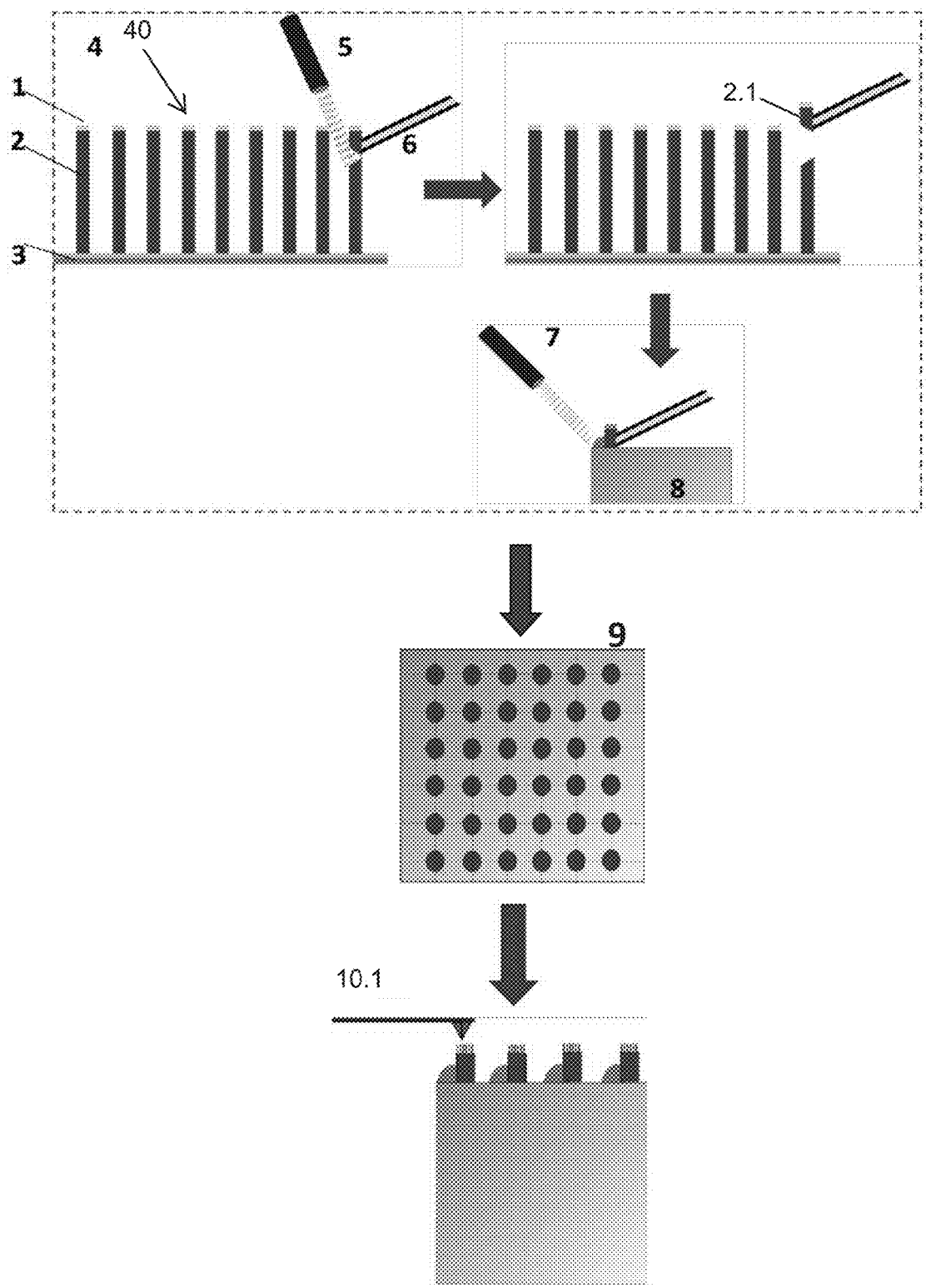
FIG. 1(a) illustrates a process flow for high throughput SEM and AFM for characterization of nanostructures in accordance with an embodiment of the present invention.

High throughput microscopy techniques are essential for large scale nanosensor manufacturing. Hence, automated techniques are needed to locate and sample representative nanostructures from among a forest of vertically standing nanostructures. The samples should be stabilized mechanically (by attaching with tips facing in desired orientation on a pre-determined substrate, so that a lower aspect ratio segment of nanostructure with its top is available for scan.) such that they can then be characterized using AFM.

The present invention relates to the field of methods and apparatus used in Scanning Electron Microscopy (SEM) and Atomic Force Microscopy (AFM), including but not limited to, for measuring the dimensions, size distribution, physical and chemical properties of free standing nanostructures.

More particularly, the invention relates to methods and apparatus consisting of tip/tilt kinematic platform, precision suction probe, control software system, SEM and AFM protocols to characterize nanostructured surfaces manufactured at a large scale in an automated and less time consuming way.

The present invention provides an apparatus and method used for high throughput SEM and AFM for characterization of nanosensor samples surfaces covered with multiple vertically free standing nanostructures.

The apparatus includes a tip/tilt kinematic platform that is compatible with SEM chamber and AFM stage, a precision suction probe, and a processor including software that controls a set of stepper, servo motors or piezo electric actuator for the platform and suction probe. The software uses SEM images as feedback for aligning free standing nanostructure(s) and handling of free standing nanostructure(s) with the suction probe for clipping a straight tip sample.

The method includes performing Scanning Electron Microscopy (SEM) and Scanning electron microscopy with energy dispersive X-ray spectroscopy (SEM-EDX) of the nanosensor sample, orienting specified free standing nanostructure(s) on the kinematic platform under SEM or SEM-EDX, cutting the tip of nanostructure(s) and re-attaching these nanostructure(s) tip sections on to a perfectly leveled carrier substrate and re-scanning with the SEM or SEM-EDX, scanning the nanostructure tip(s) on the substrate using Atomic Force Microscopy (AFM) and overlay the images for characterization. The tip sections are attached at the base to a leveled carrier substrate, which makes the tip sections stand upright for AFM scans.

The precision suction probe is used to handle individual free standing nanostructures on the nanosensor sample mounted on the tip/tilt kinematic platform within the SEM chamber. SEM imaging is used by the processor to navigate the suction probe to the specified nanostructure. The handling mechanism is based on vacuum suction. While the suction of the suction probe holds the free standing nanostructure, a focused high energy electron/ion beam (FIB) is used to cut off the nanostructure at specified length which is straight and has the tip. The straight nanostructure tip is attached on a smooth substrate using ion beam assisted deposition of metal at the base of the nanostructure.

The tip/tilt platform and suction probe are machine controlled (defined x, y, and z coordinates). The FIB and ion beam assisted deposition system is provided as part of the SEM equipment as illustrated in FIG. 1(b) discussed below. In this regard, SEM machines have the Focused Ion Beam (FIB) component, such as Helios NanoLab 400—FEI by Nanolabs technology and FIB-SEM by Ziess. The FIB 5/7 column/gun is mounted on the SEM chamber body at an angle to the SEM column). The smooth substrate with straight nanostructure tips is imaged using SEM to confirm the location of individual attached nanostructure tips on the platform, so that an array of such free standing nanostructure tips, attached on smooth substrate and sufficiently spaced, can be used for AFM analysis.

The known coordinates (x, y, z) of each nanostructure tip on the substrate, obtained from the SEM image, are fed into the AFM software in form of a pre-programed batch file, which can be done manually, or can be semi-automated or fully automated. The AFM scan data is then overlaid on the SEM image to obtain nanostructure measurements such as surface roughness measurements, nanostructure dimension measurements, and mechanical strength measurements that can be averaged across the entire surface to give mean and variance of the measured property, and also to obtain physical and chemical properties maps, such as such as an electrical conductivity distribution map, and a electrochemical analysis using impedance measurement at each location to generate an oxidation and corrosion map. More generally, a "properties map" may be a plot showing variation in surface properties on each spatial coordinate of the surface.

Methods and apparatus for characterization of nanostructured surfaces that consist of free standing nanostructures, using AFM and SEM, are described herein. These free standing nanostructures are made of materials that have the structural properties and processability to achieve nanometer scale structures such as polymers as single polymer or combination of two or more immiscible polymers coated with metals, metal oxides, polymers or graphene. The nanometer scale structures are also made of metals such as gold, platinum, nickel, cobalt, palladium nanowires; metal oxides such as zinc oxide, and iron oxides (in different crystal structures- maghemite, hematite), manganese oxide nanorods. The nanostructures are also made of graphene materials such as carbon nanotubes and nanocoils. The exception to this method could be materials that cannot be milled using a focused ion beam. The nanostructures can be free standing cylindrical, helical or branched structures having different cross sectional shapes such as circular, multi-lobal, square and triangular.

Figure 1B:
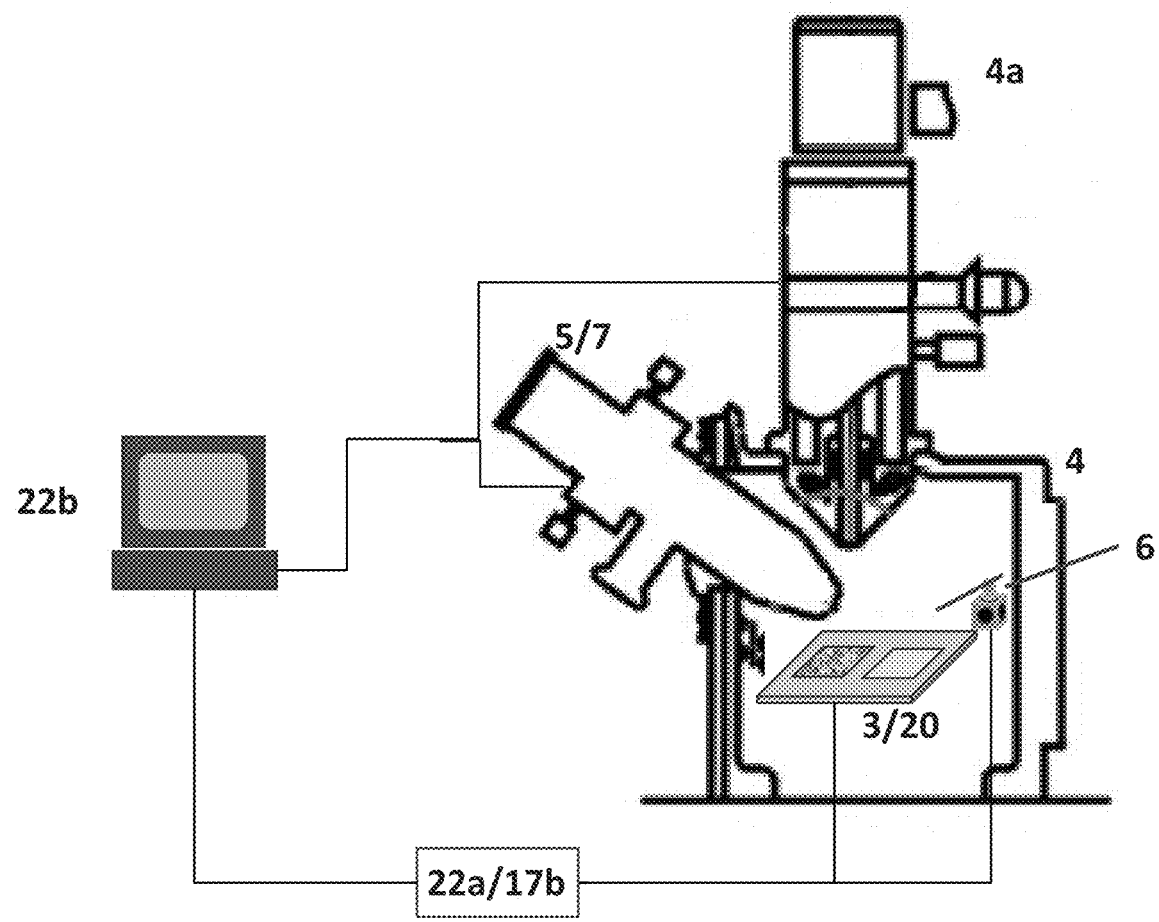
FIG. 1(b) shows an exemplary SEM stage including a tilt/tip platform, suction probe, sample, and substrate.

The characterization of a nanostructured surface with free standing nanostructures is performed by using a combination of SEM and AFM as shown in FIG. 1(a). The exemplary nanostructures have a hierarchical structure, with nanometer scale pillars 1 on top of micrometer stocks 2. A sample 40 of nanostructured surface is mounted on base 3 of a tip/tilt kinematic platform 20 which is placed in a SEM chamber 4. The sample is imaged in order to locate the nanostructures with respect to the platform base 3. A SEM-EDX is performed on the sample to obtain an elemental analysis and elemental distribution of the sample.

Also included in the SEM chamber 4 is a vacuum suction probe 6 and substrate 8. The vacuum suction probe 6, designed to capture a single nanostructure, is controlled by a processor using SEM imaging to navigate to a specified nanostructure on the sample 40. FIG. 1(b) shows an illustrative SEM arrangement including an SEM chamber 4, an SEM source 4a, focused ion beam 5/7, suction probe 6, and tilt tip platform 20 including base 3, on which is located sample 40 and substrate 8. Processing is controlled by software hosted in a computer 22b and a microstep controller 17a/22a for controlling the probe 6 and platform 20. The microstep controller 17a/22a can be a part of the stepper motor assembly such as M-11x Compact Micro-Translation Stage by Physik Instrumente or be placed outside of the SEM chamber and connected with stepper motors by wires such as C-663.12 Mercury Step by Physik Instrumente. The processor—stepper motor system is used for probe (22b and 17b) and tip/tilt table (22b and 22a). The FIB 5/7 position and switching mechanism are controlled in a conventional manner by SEM machine software, as is known in the art, under the supervisory control of computer 22b.

High energy focused ion-beam ablation is done using a Focused Ion Beam (FIB) 5 to cut off a free standing nanostructure segment 2.1 of specified length, while holding the free standing nanostructures 2 with a vacuum suction probe 6. These nanostructure segments 2.1 are straight and have the tip of the nanostructures. An FIB is a beam consisting of ion stream such as Ga$^+$. Ablation is done using the milling capability of FIB to cut the nanostructures, which is done at high beam currents and can use gas (delivered at the site of milling) such as $I_2$ and $XeF_2$. The precision suction probe 6, which already has the nanostructure segment 2.1 attached to it, moves the segment 2.1 to the smooth glass/silicon substrate 8 which located on the base 3 of the tilt/tip platform 20.

The base of the straight nanostructure segment is attached to face of the smooth glass/silicon substrate 8 byfocused e-beam induced deposition of metal 7 at the base of the nanostructure segment 2.1, which is touching the smooth substrate surface 8. In this regard, the smooth substrate preferably has a surface roughness ranging from 0.1 to 1 nanometer (rms). This process is a FIB assisted metal deposition process that uses organo-metallic compound gases as precursors for metal deposition such as trimethyl (methyl cyclopentadienyl) platinum (IV) for platinum deposition. When the compound is exposed to the ion beam 7 it decomposes and Platinum is deposited on the specified site. The deposition process is also performed in the SEM 4, controlled by the SEM software/processor under supervisory control of computer 22b, and e-beam induced deposition 7 can be provided using the same FIB 5 used to cut the tip 2.1. As noted above, motion control for the FIB 5 and deposition 7 is provided in a conventional manner as part of the SEM system as is known in the art, under supervisory instruction from computer 22b.

The tip/tilt platform 20 is machine controlled (defined x, y, and z coordinates) to place an array 9 of nanostructure segments 2.1 on the smooth substrate 8. In this regard, the tip/tilt kinematic platform 3/20 has both the nanostructured surface sample 40 and the smooth substrate 8. The suction probe 6 is machine controlled (x, y, z) for handling nanostructure segment 2.1. After the nanostructure segment 2.1 is removed from the sample, the tip/tilt platform 20 is machine controlled (x, y, z) to place the segment 2.1 on the smooth substrate 8.

The smooth substrate 8 with straight nanostructure segments 2.1 is then imaged using SEM to confirm the location of the array 9 of segments 2.1 on the substrate. The x and y coordinates of nanostructure segments' location on smooth substrate 8 and the nanostructure segment top dimensions are pre-programed and entered as a batch file into AFM system. With regard to the segment top dimensions, the cut length of the tips 2.1 is determined by the aspect ratio (diameter:height) required for the AFM scan such as 1:4 for tip surface scan and higher than 1:4 for any mechanical or chemical tests.

This batch file is used to navigate the AFM tip 10.1 over the tops of the nanostructure segments 2.1 as discussed below. After SEM imagining, the smooth substrate 8 with nanostructure segments 2.1 is moved from the SEM chamber to the AFM, preferably while remaining on base 3 as discussed below. As noted above, the batch file (which includes x and y coordinates of nanostructure segments' location on smooth substrate 8 and the nanostructure segment top dimensions) provide the information needed to allow processing in the AFM 10. Preferably, computer 22b also controls the AFM processing as discussed below. Further, in a preferred embodiment, movement of platform 3 with the smooth substrate 8 from SEM chamber to AFM is controlled by the computer 22b, for example, with the assistance of a computer controlled robotic arm.

Figure 2A:
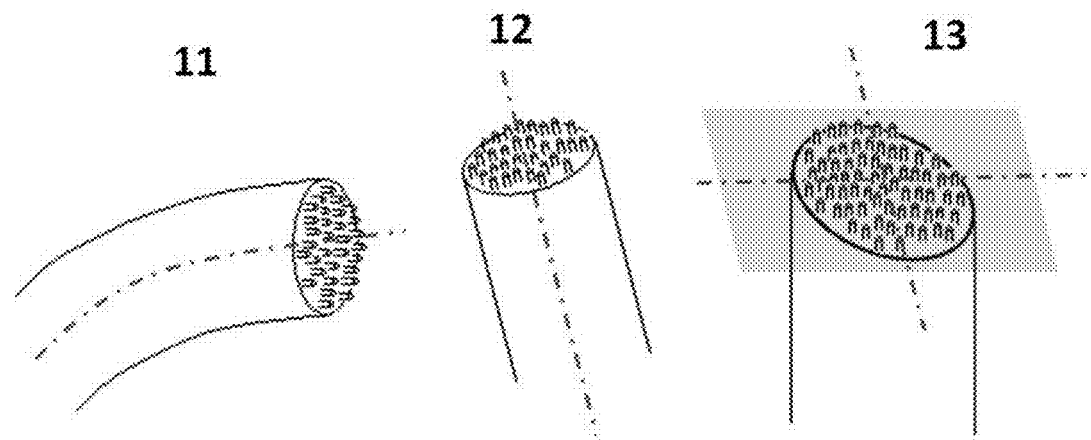
FIGS. 2(a,b) show exemplary nanostructures orientation and alignment correction using the apparatus and method according to an embodiment of the present invention.
Figure 2B:
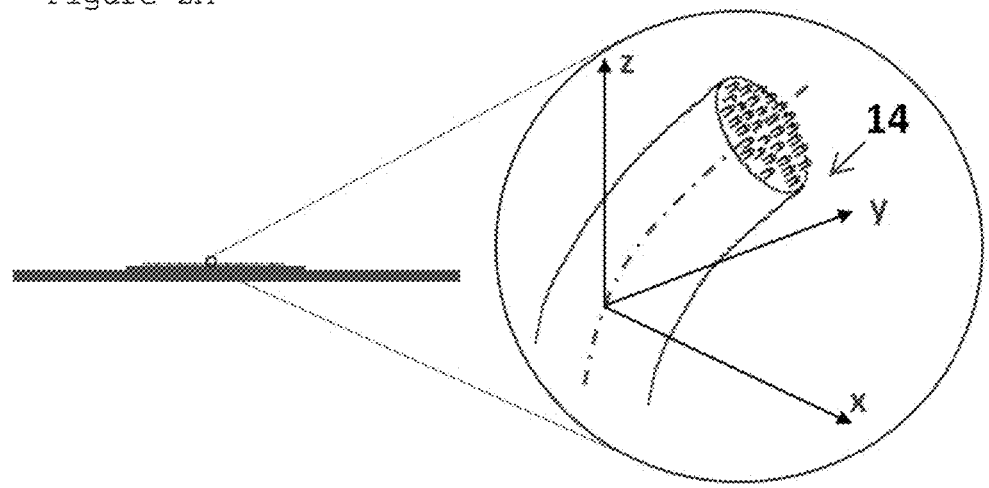
Figure 2B:
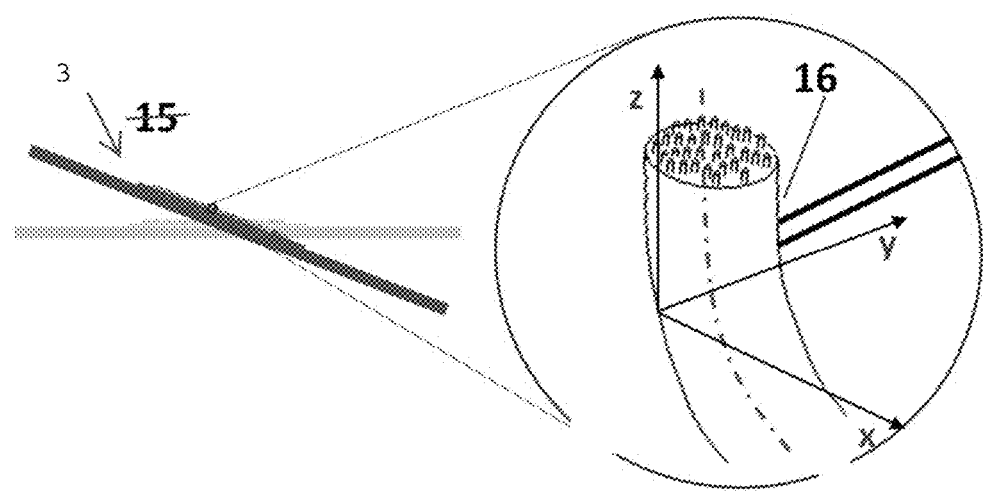

Manipulation of Nanostructures for Adjustment of Angle of Approach for Vacuum Suction Probe Prior to moving the nanostructure segment 2.1 with probe 6, it is necessary to manipulate nanostructures that are not facing up (e.g. 11,12,13 as shown in FIG. 2(a)). Referring to FIG. 2(b), software in computer 22b is used for identifying the orientation of individual nanostructure 14a ttached to the nanosensor substrate sample 40 based on the SEM of nanostructures' tops from multiple directions. The software uses SEM images as reference to control a tip/tilt kinematic platform 3/20 and subsequent SEM images as feedback to accurately move the base 3 of the platform 20. The base 3 of the tip/tilt kinematic platform 20 is tilted to orient the nanostructure top 16 of nanostructure 14vertically, so that a vertically standing nanostructure segment 2.1 can be removed from nanostructure 14.

Figure 3A:
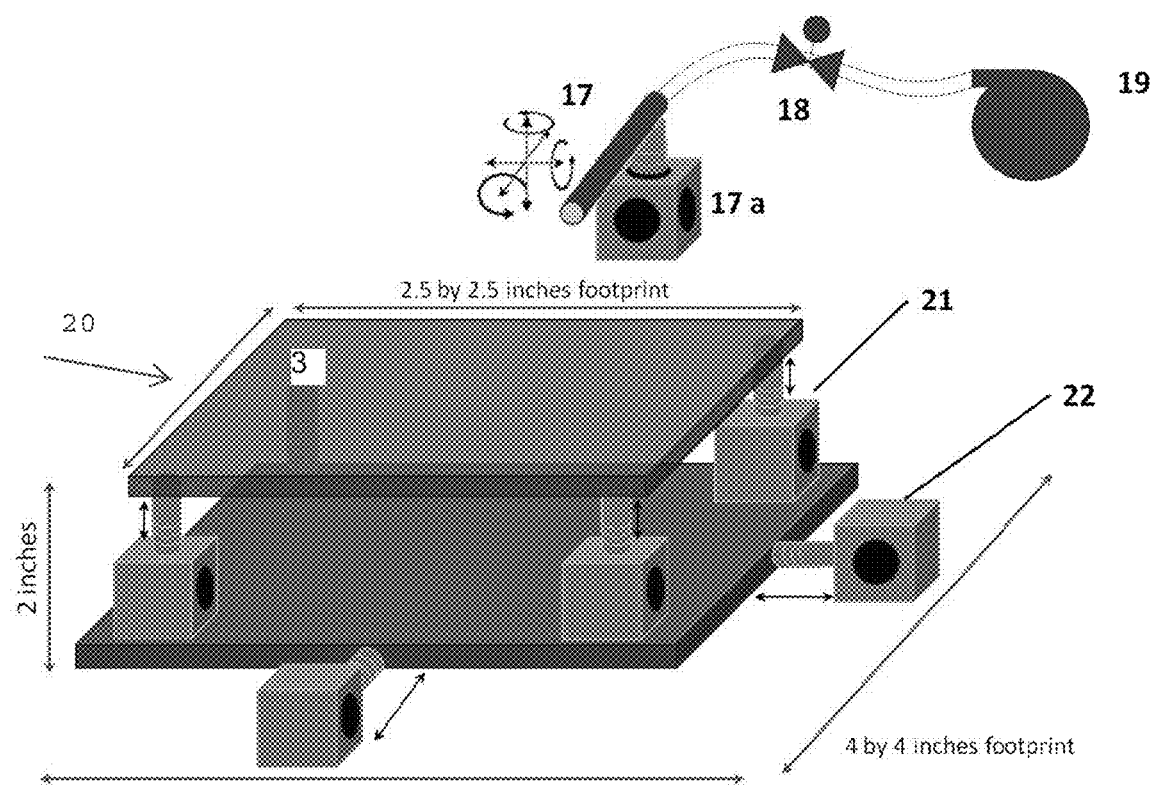
FIG. 3(a) shows an exemplary design, dimensions and configuration of a precision suction probe and a tip/tilt kinematic platform in accordance with an embodiment of the present invention.
Figure 3B:
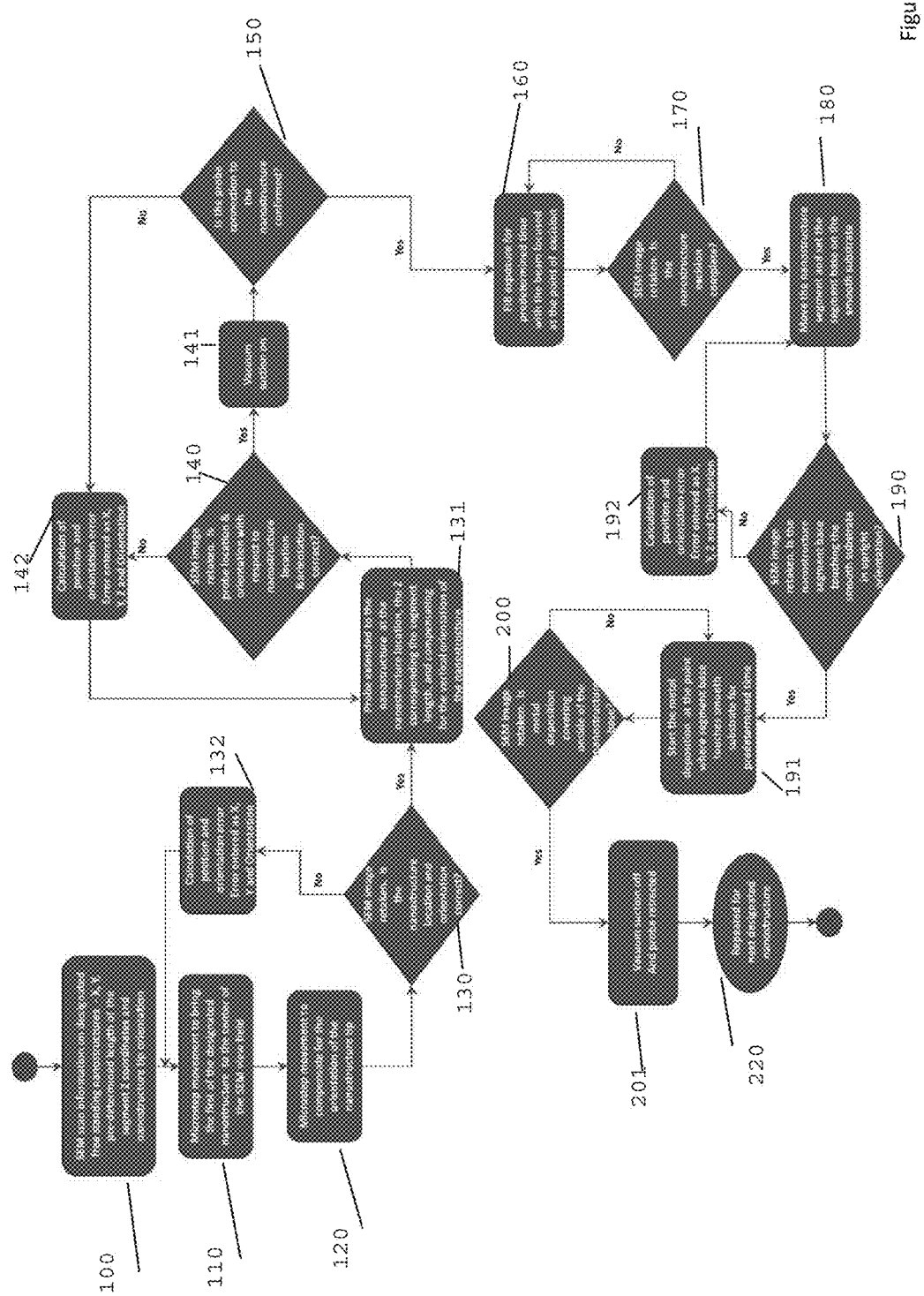
FIG. 3(b) is a flowchart showing exemplary process steps for removing a nanostructure segment from a sample, and placing it on a substrate.

Referring to FIG. 3(a), the precision suction probe 6 includes a suction nozzle 17, a miniature vacuum pump 19and electronically controlled flow control valve 18. It uses vacuum suction strength for holding nanofilament 2 at tip 2.1. The diameter of suction nozzle bore is dependent on the dimensions of the nanostructure to be handled. For micrometer stock, as shown in FIG. 1, a 1-50 micrometer diameter needle bore can be used, and for nanometer scale samples, a 5-100 nm diameter needle bore can be used. The suction strength does not affect deposition of metal and easy release after attachment. The vacuum pump 19 output should have an output range of from about 0.05 ml/min to about 18 ml/min, which can be controlled by flow control value 18. The size of the pump 19 is preferably less than 10 cubic centimeters and can be accommodated within the SEM chamber 4. The probe is mounted on a stepper motor and screw gauge setup 17a for controlling the pitch, yaw and roll of the suction nozzle 17. For example, stepper motor and screw gauge set up may include a 3 axis lateral and rotational movement control system comprising of 3 lateral microstep controllers and 3 rotational microstep controllers. The microstep controller can be a part of the stepper motor assembly such as M-11x Compact Micro-Translation Stage by Physik Instrumente or be placed outside of the SEM chamber and connected with stepper motors by wires such as C-663.12. The probe 17 may, for example, be mounted to the micro-translation stage or other platform. The setup 17a also allows for extending micro suction nozzle to and from the sample and moving it sideways along one edge of the tip/tilt kinematic platform. The setup is driven by a SEM image based feedback to move the probe towards the specified nanostructure/nanopillars. Source gases, for metal deposition, can have flow rate of 0.05 to 20 sccm. As a person of ordinary skill in the art will appreciate, the source gas inlet and FIB are available as part of commercially available SEM systems and can be programmed to meet these requirements. The probe 6 and microstep controllers 21 and 22 for platform 3/20 are connected to computer 22b using data cables FIG. 3(b) is a flow chart illustrating exemplary process steps for removing segments 2.1 from the sample 40 and placing them on substrate 8 as an array 9. The steps shown in FIG. 3(b) are for capturing one nanostructured segment, which can be repeated for the required number of segments 2.1 to be extracted.

Referring to FIG. 3(b), in step 100 an SEM scans nanostructures on the sample. In steps 110-130, 132, the sample 40 is reoriented using SEM images until a first of the designated nanostructures are in a proper orientation for cutting (e.g., a straight, vertically standing end). In steps 131, 140, and 142, the probe is moved into proper position using SEM images. In step 141, 150 the vacuum is turned on so that that the end of the first designated nanostructure is secured. In steps160-170 the FIB 5 excises the nanostructure segment at the top of the nanostructure and confirms excising using SEM images. In steps 180, 190, 192, the nanostructure segment moved to the substrate 8, with the base of the segment on the substrate, and confirms contact of the base with the substrate using SEM images. In step 191, metal deposition is performed, assisted by the FIB 5. At step 200, SEM images are used to confirm that the metal deposition covers the side of the nanostructure base. The vacuum suction is then removed, and the probe 6 retracted (step 201), and then the process repeats for the next designated nanostructure (step 220).

An alternative to the suction probe can be a nanotweezer, which can be used for handling nanostructures. An alternative to the stepper motion can be servo motors or other variable speed motors such as piezo electric actuator. The cut length of the tips 2.1 is determined by the aspect ratio (diameter:height) required for the AFM scan such as 1:4 for tip surface scan and higher than 1:4 for any mechanical or chemical tests.

Tip/Tilt Kinematic Platform for Manipulation of Nanofibers

FIG. 3(a) shows an exemplary platform 3 in the form of Tip/Tilt Kinematic platform 20. Platform 20 is a 3 axis tilt with nanometer precision driven by control software for aligning free standing nanostructure(s) for clipping a straight nanofilament top sample to provide proper orientation for the probe to handle the individual nanofilament perpendicular to the nanofilament axis. The platform is driven by stilts with up and down movement using a microstep controller and stilts 21 and lateral movement using a microstep controller and stilts 22. The microstep controller can be a part of the stepper motor assembly such as M-11x Compact Micro-Translation Stage by Physik Instrumente or be placed outside of the SEM chamber and connected with stepper motors by wires such as C-663.12 Mercury Step by Physik Instrumente. The setup 21, 22 is driven by a control software that uses a SEM image based feedback to drive the stepper motors to move the platform as shown in FIG. 3(b), steps 110-132.Thus orienting the stage such that a straight segment of specified nanostructure is obtained that also has the top of the nanostructure.

The Tip/Tilt Kinematic platform 20 has a 3 axis tilt with nanometer precision along 6 degrees of freedom: lateral movement range of ±20 mm along 3 axes and rotation movement range of ±40° about 3 axes with a least count of 1.8° per step. The platform 20 and motors 21, 22 have a 4 by 4 inch footprint, capable of housing a nanosensor sample and a smooth substrate within a space of 2.5 by 2.5 inches.

Figure 4:
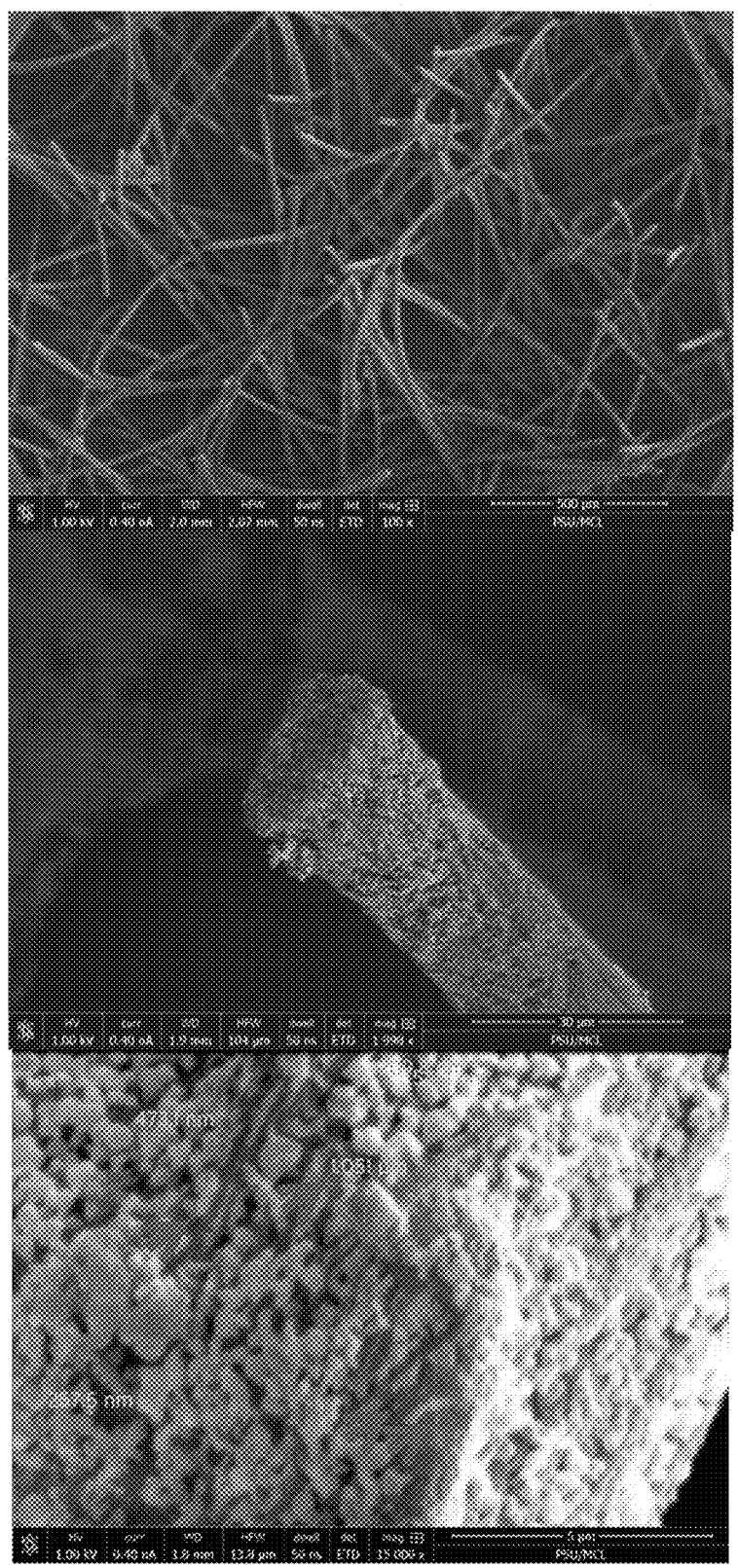
FIG. 4 shows a nanosensor sample image (top), an image of an individual nanostructure on the surface of nanosensor (middle), and an image showing silver nanoparticles size measurements (bottom).

An exemplary nanostructured surface sample 40 coated with a layer of silver nanoparticles, is mounted on the tip/tilt kinematic platform 20. The sample is imaged for locating nanostructures and measuring the silver nanoparticles size as shown in FIG. 4. In particular, FIG. 4 shows a nanosensor sample image (top) of a sample 30 on platform 20, an image of an individual nanostructure (stock 2 and pillars 1) on the surface of nanosensor (middle), and an image showing silver nanoparticles size measurements on pillar 1 (bottom).

Figure 5:
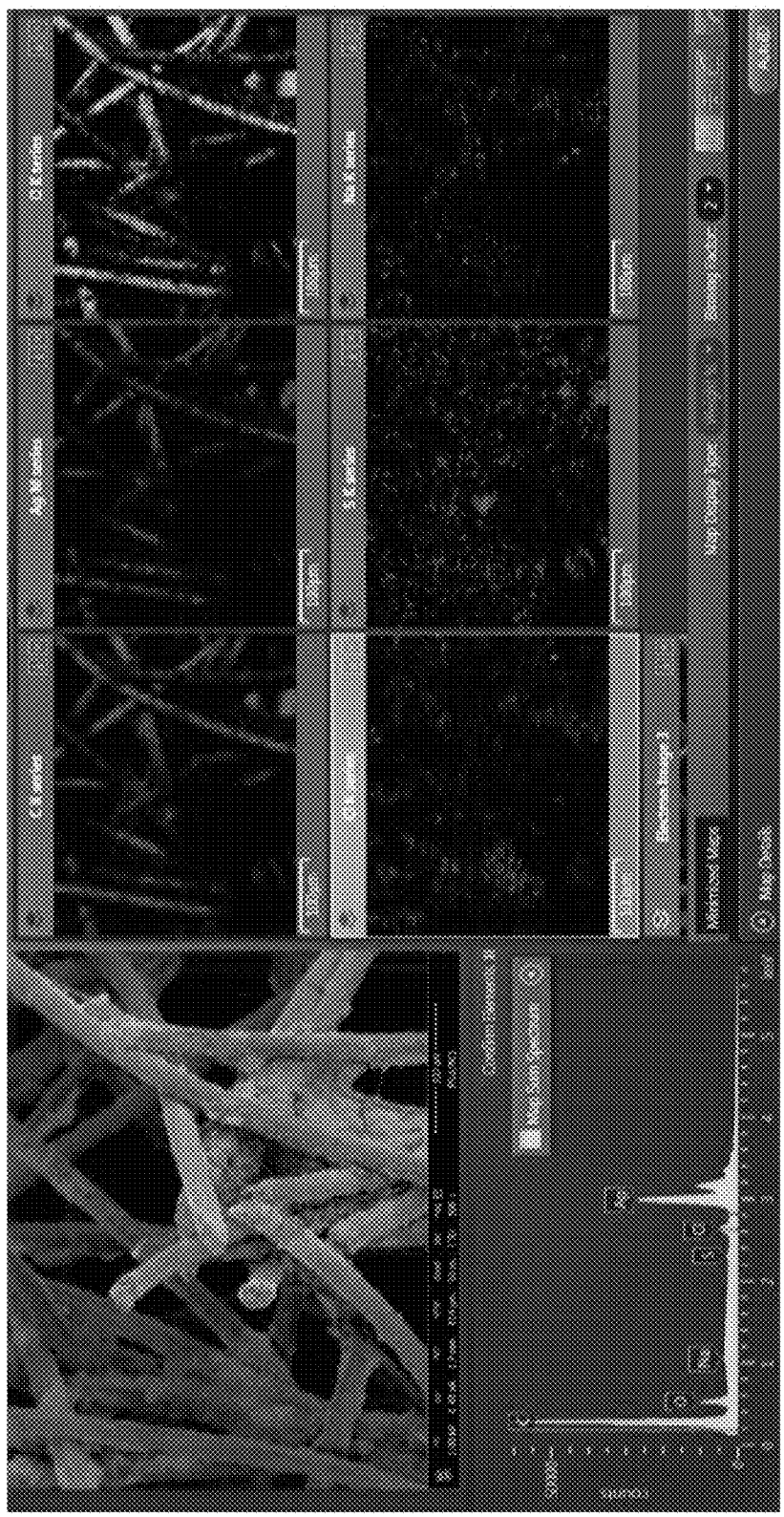
FIG. 5 shows an SEM-EDX scan (top left), an elemental analysis (bottom left), and distribution on the nanosensor surface (right).

A SEM-EDX is performed on the sample to obtain an elemental analysis and elemental distribution as shown in FIG. 5. In particular, FIG. 5 shows an SEM-EDX scan (top left), an elemental analysis (bottom left),and distribution on the nanosensor surface (right), including images of C K series, Ag M series, O K series, Cl K series, S K series, and Na K series, each with a 100 µm scale.

AFM Fiber Surface Characterization

The array 9 of free standing nanostructure segments 2.1 attached on smooth substrate 8 located on platform base 3 is used for AFM analysis. The platform base 3 of tilt/tip Kinematic platform 20 is detached from the stilts, removed from the SEM chamber, and mounted on a leveled AFM stage in the AFM 10. The mounting mechanism can, for example, be vacuum suction provided on the AFM stage as is known in the art. The platform 20 is mountable on AFM stage with accurate height and tilt alignment to allow for AFM scan coordinated to match with that of SEM scan coordinates. As a person of ordinary skill in the art will appreciate, an AFM typically includes an AFM stage which is movable along x,y,z axis, and the stage is typically located below an AFM tip which functions the probe in the AFM.

Figure 6:
FIG. 6 shows an SEM scan of a nanostructure array for estimation of z plane adjustment to approximate AFM tip lowering to height of the top of nanostructure; an AFM scan of the nanostructure top; and features on AFM scan matched to the locations on the SEM image to add the surface topography information.
Figure 6:
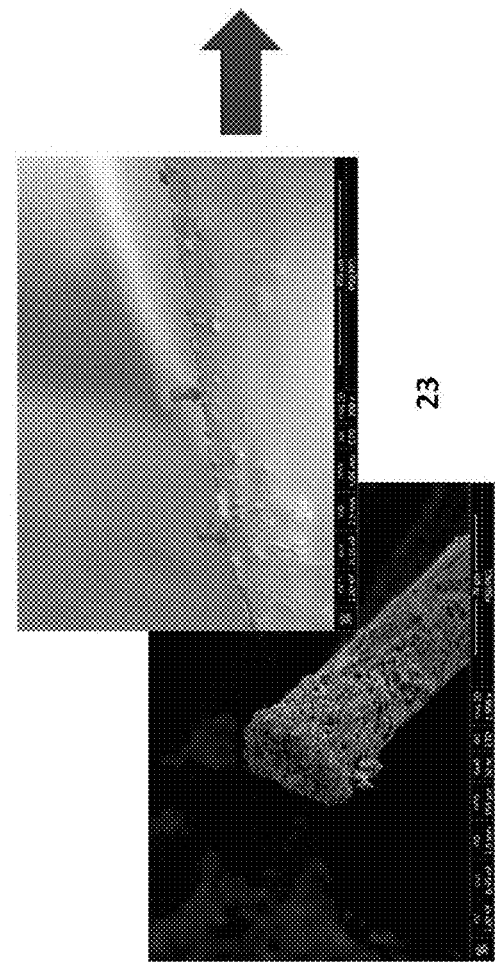
Figure 6:
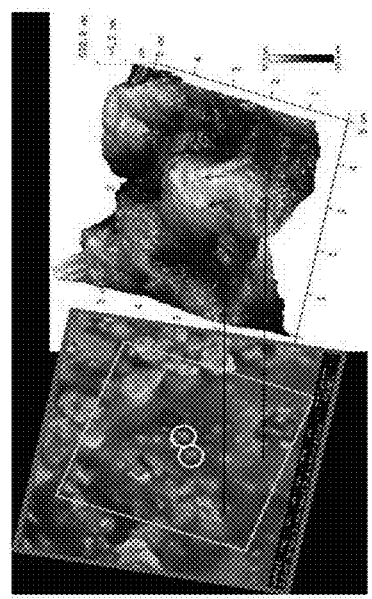

The Batch file with x,y coordinates and a z plane adjustment, based on the SEM scan 23 of the array 9 (FIG. 6) is intended to accommodate for AFM tip 10.1 lowering to approximate height of the top of nanostructure segment. This is done to decreases scan time. If the tip is not touching the top of nanofilament, the tip height is adjusted automatically through a force feedback loop until the tip 10.1 is in contact with the top of the nanofilament. In FIG. 6, image 23 shows the array 9 with a 440 µm scale, and to the left of image 23 is an image of a nanostructure 2.1 with a 30 µm scale.

The AFM scan, in tap mode, of the nanostructures' top is used to analyze surface roughness (topography) and any functional coating on the surface. The analysis is done by overlaying the AFM images on the SEM images of the tip of the nanostructure segment 2.1. Image 24 shows an SEM image of the crown of the tip (left) and the AFM surface scan (right) of the same location as shown on the SEM image. The surface scan is n AFM scan of the same location as shown on the SEM image. The on AFM scan are matched to the locations on the SEM image in overlay image 25, as shown in FIG. 6, to add the surface topography information. In this regard, the image processing to identify features is done by analyzing the image pixel matrix using software tools such as MATLAB image processing tool box. The properties overlay uses the image pixel labels to associate the properties. The overlay image 25 shows the physical features labeled with 2 arrows on the surface scan, (to the right, in color) which are matched to the features as shown in the SEM image (to the left, in black and white) by 2 circles. The overlay image 25 shows how 3 dimensional information of the features from AFM is compared to the 2 dimensional SEM image of the features. Other AFM analysis can be done for measurement of physical and chemical properties depending for different applications as explained in following sections

Scanning of Vertically Free Standing Biocomponent Fiber with Hierarchical Nanostructure A bicomponent fiber is made of a combination of two polymers, that are mutually immiscible, that can be drawn in to yarn by co-extrusion. The yarn is made of one polymer forming long filaments, of nanometer scale diameter, in a matrix of the other polymer thus forming a micrometer scale diameter stock. A cross-section of such a fiber shows that nanometer fibers of one polymer are distributed in matrix of the other polymer, thus giving the impression of islands in sea. This yarn is cut into fibers. These fibers are then deposited in a vertically upright position on a flat surface. The clusters of vertically free standing nanostructure filaments at the fibers' top are formed after dissolving the matrix polymer. The constituting materials and methods of the same are described in further detail in US 2018/0080126, 2017/0226643, and 2016/0222539, each entitled Large Scale Manufacturing of Hybrid Nanostructured Textile Sensors.

Figure 1C:
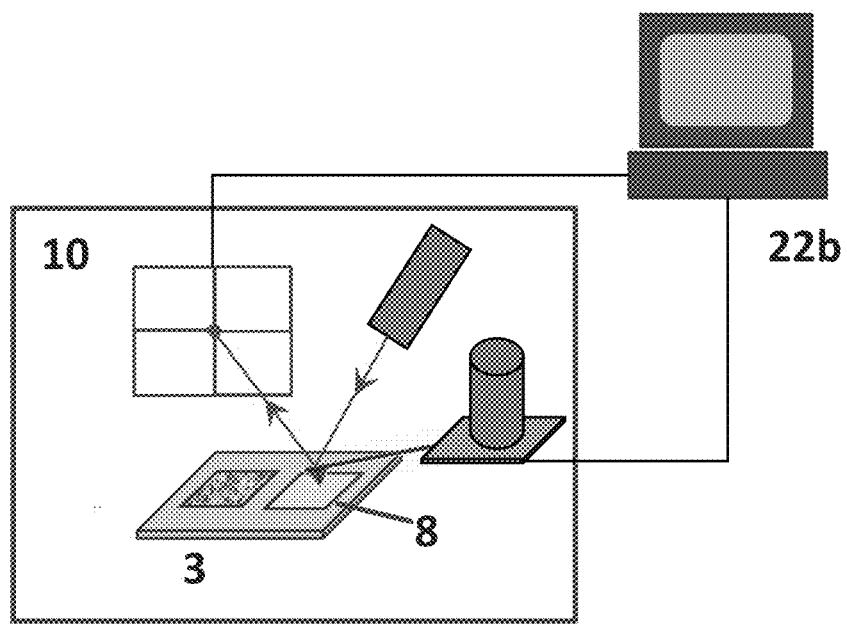
FIG. 1(c) shows an exemplary AFM stage including AFM tip, platform, sample, and substrate.

The nanometer scaled filaments 1 are exposed at the top of a micrometer stocks 2 as shown in FIG. 1. This structure is coated with a layer of silver nanoparticles. Accordingly, this use case requires measurements size of nanoparticle that form a functional coating on the nanofilaments, shape of nanoparticle that form a functional coating on the nanofilaments, coverage of nanoparticles that form a functional coating on the nanofilaments. The method and apparatus described in FIG. 1 can be used for characterization of the nanostructured surface with free standing nanofilaments on a microstock by using a combination of SEM and AFM as shown in FIG. 1(a)-(c). As discussed above, the substrate 8 with the array 9 of nanostructure segments 2.1, is mounted on tip/tilt platform 3/20. (FIG. 1(b)). Base 3 of platform 20 is moved from an SEM chamber to a conventional AFM platform 10 (FIG. 1(c)). The base 3 of platform 20 is held down on the AFM platform by the built-in vacuum system for holding down normal AFM samples.

The above mentioned nanostructured surface 1,2 is mounted on a tip/tilt kinematic platform 3 placed in a SEM chamber 4. The sample is imaged for locating nanofilaments and measuring the silver nanoparticles size. A SEM-EDX is performed on the sample to obtain an elemental analysis and elemental distribution within the nanostructured fiber surface and functional coating. The suction probe 6 uses SEM imaging to navigate to the specified nanofilament. This is followed by specified nanofilament segment cut and mount on smooth substrate 8. The substrate 8 is then removed from the SEM chamber 4 and placed in the AFM stage 10 for AFM characterization of the nanofilament segments' top surface for roughness.

Using the force spectroscopy plots from the AFM tip 10.1 scan data, the adhesive forces between nanostructures and functional film as well as adhesive forces between nanostructures and coatings such as metallic conductive coating can be calculated.

Measurement of Electrochemical Properties of Vertically Free Standing Nanostructures in Skin Contact for Wearable Health Monitoring Applications Vertically standing conductive nanostructures provide large contact surface area between the sensor and skin, which results in low skin-electrode contact resistance. Thus, it helps in increasing the sensitivity of sensor electrodes. This property makes them useful for long term monitoring and measurement of biopotential signals such as electrocardiography (ECG or EKG), electroencephalography (EEG), electrooculography (EOG), electromyography (EMG) and bioimpedance for Impedance Cardiography (ICG) with very low baseline noise, and sweat metabolite detection application. The SEM and AFM setups, described below, enables analysis of conductive nanostructured sensor performance in wearable health monitoring applications.

Figure 7:
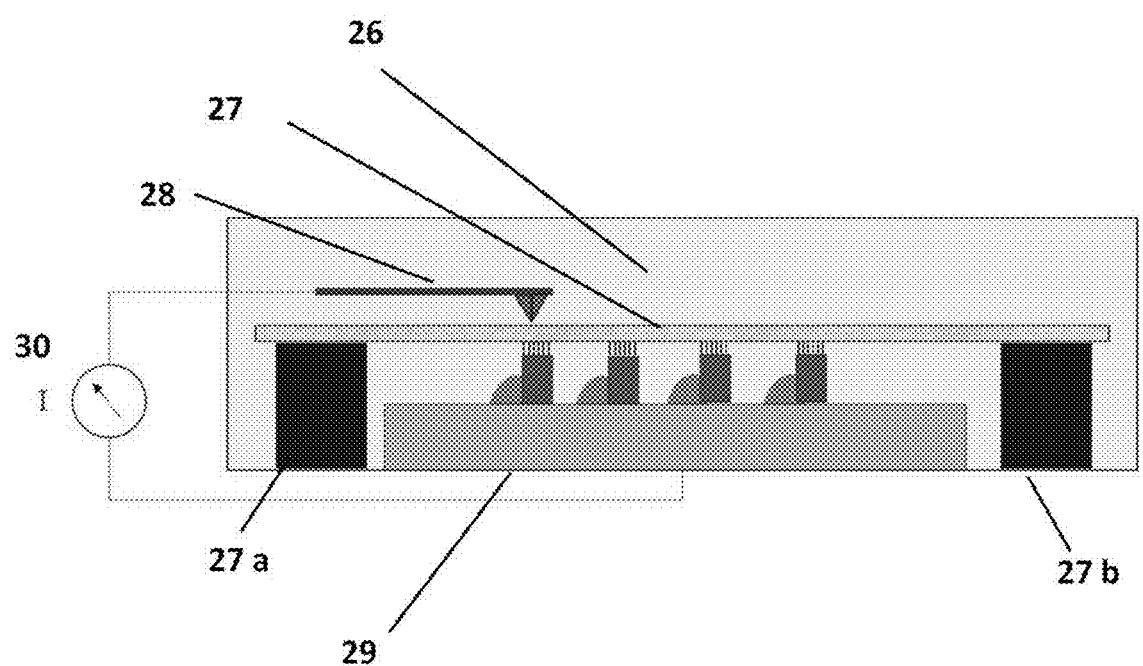
FIG. 7 shows an exemplary design of AFM set up used for testing for electrochemical properties of nanostructures while in contact with the skin graft/phantom in accordance with an embodiment of the present invention.

The SEM scan and preparation of nanostructured segments sample for AFM, as described above, can be used for measurement of surface, chemical and physical properties of the nanostructures' tops using the capabilities of a standard AFM setup. The AFM setup can be useful for measurement of other physical and chemical properties of the nanostructures. One use case is shown in FIG. 7, where the set up is used for testing for electrochemical properties of nanostructures while in contact with the skin graft/phantom with tissue like electrical properties and/or chemical composition. In this use case, the substrate 8 is a conductive silicon wafer (<100> heavily doped n-type silicon)on the platform base 3 (depicted together as wafer/platform 29). The AFM stage and the wafer/platform 29with nanostructure segments attached to the conductive silicon wafer (<100> heavily doped n-type silicon) are submerged in liquid fluid medium 26 or a controlled environment such as skin tissue phantom or graft 27 with simulated sweat and optional metabolites. The skin tissue phantom or graft 27 is mounted on a set of spacers 27a, 27b that hold it above the substrate. First a dry AFM scan is done then a fully submerged (wet) AFM scan is done. The wet AFM scan is done in a liquid fluid environment (such as saline solution, water, oil) with a thin skin graft/phantom 27, parallel to the wafer/platform 29, touching the vertically free standing nanostructure segments on one side of the thin skin graft/phantom and AFM tip 28 doing a scan in trace mode to pick up electrochemical signals from the other side of the thin skin graft/phantom.

The variation in height of the nanostructure segments is compensated by lowering the thin skin graft/phantom to a height that is nanostructure segments target height minus the variation (as calculated from the SEM scan data and pre-programmed segment height information). The AFM tip 28, which is lowered using a force feedback loop based control, follows a pre-programed path according to the nanostructure segments position (SEM) batch file. The instrumentation electronics 30, which is a part of AFM setups such as AFM attachments N9545F and N9410S for scanning electro-chemical microscopy from Keysight Technologies, uses AFM tip 28 as one electrical pole and the conductive silicon wafer base of wafer/platform 29 as the other electrical pole.

For biopotential and bioimpedance sensing nanostructured electrodes with vertically free standing nanostructures, electrical characterization can be done with the following exemplary setup. The instrumentation electronics 30 can also be a connected to a test stack for measuring current when a pre-determined voltage and frequency is applied between the AFM tip 28 and the conductive silicon wafer base 29 to measure contact impedance and electrochemical properties for nanostructured electrodes samples consisting of nanofilaments, coated with electrically conductive material such as silver nanoparticles, while in contact with the skin graft/phantom. The AFM can also be connected to Impedance analyzer and Cyclic Voltometry equipment, such as 5500 AFM base with an atomic scanning tunneling microscopy (STM) scanner from Keysight Technologies, to run electrochemical, corrosion and stability experiments. After the test, the sample is freeze dried to perform a SEM scan to study change in surface of the nanostructure segments' tops. AFM testing can be done to analyze binding strength and other properties, such as elastic modulus and structural stability, of the nanoparticulate or continuous phase thin films on nanostructures.

AFM provides the option of simulating use cases in control micro-environments as described in paragraph above. The setup with instrumentation electronics 30 using a test stack for measuring current when a pre-determined voltage and frequency is applied between the AFM tip 28 and the conductive silicon wafer base 29can be used for measuring charge transfer between the nanostructures and a test substrate in direct contact or in non contact mode in a well-defined liquid medium 26 (such as saline solution, water, oil). These tests are especially applicable to studying nanoparticle/nanostructure degradation profile under accelerated (e.g. thermal) degradation protocols for corrosion, degradation and biocompatibility studies on nanosensors for wearable health monitoring. The well-defined medium can also be made a barrier selectively permeable to particular ions, thus measuring ion transfer characteristics for sweat metabolites detection application.

Modification of Vertically Free Standing Nanostructures Tops to Introduce Specific Functionalities The SEM and AFM method, described above, and additional setup described here can be used for nanostructure top modification to impart functional (physical and/or chemical) properties for specific sensing application. This set up is useful for development of multiple biological or chemical marker detection sensor fabrication and analysis and nano electronics fabrication. This is done by obtaining the array 9 of nanostructure segments 2.1 on a smooth substrate 8, as described above, and attaching functional molecules or nanostructures on the nanostructure segments' top. This is done using the AFM tip 10 as a handle or tool for modification and manipulation of nanostructures by machining through force variation, dip pen lithography for functional biomolecules attachment, indentation by force variation techniques. In this manner, this embodiment obtains a well-ordered array of nanostructures with one or more functional properties precisely distributed among each nanostructure in the array. CAD based AFM tip control for nanometer scale patterning, micro-environment for humidity and temperature control for dip pen nanolithography and force variation control are available in AFM setups such as 5500, 5400, and 5100 AFM/SPM and 7500 AFM from Keysight Technologies.

In the preceding specification, the invention has been described with reference to specific exemplary embodiments and examples thereof. It will, however, be evident that various modifications and changes may be made thereto without departing from the broader spirit and scope of the invention as set forth in the claims that follow. The specification and drawings are accordingly to be regarded in an illustrative manner rather than a restrictive sense.

Obvious variants of the disclosed embodiments are within the scope of the description and the claims that follow.

All references cited herein, as well as text appearing in the figures and tables, are hereby incorporated by reference in their entirety for all purposes to the same extent as if each were so individually denoted.

What is claimed is:

1. A method of characterizing nanostructured surfaces comprising:
    (a) placing a sample including a plurality of vertically free standing nanostructures in an SEM chamber;
    (b) SEM imaging the sample in the SEM chamber;
    (c) For each of a plurality of selected vertically standing nanostructures of the plurality of the vertically standing nanostructures:
        (1) locating one of the selected nanostructures using images from the SEM imaging,
        (2) excising a top portion of predetermined length of said one of the nanostructures while holding the portion with a probe,
        (3) placing said top portion on a substrate such that the nanostructures are perpendicular to the substrate and a base of the top portion contacts the substrate, and
        (4) high energy ion beam assisted deposition of metal at the base to attach the top portion to the substrate;
    (d) SEM imaging the top portions in the SEM chamber;
    (e) determining coordinates of the top portions relative to the substrate from the SEM imaging of the top portions;
    (f) placing the substrate in an AFM chamber;
    (g) AFM imaging of the top portions using the coordinates;
    (h) using the coordinates to overlay an AFM image from the AFM imaging of the top portion on an SEM image of the SEM imaging of the top portion to an overlaid image.

2. The method of claim 1, wherein, prior to step (c)(2), the method further comprises changing a spatial orientation of the sample in the SEM chamber until the top portion to be excised is a straight segment.

3. The method of claim 1, further comprising determining nanostructure measurements and properties from the overlaid image.

4. The method of claim 1, further comprising measuring roughness of a top of free standing nanostructures using the overlaid image.

5. The method of claim 1, further comprising measuring adhesive forces between nanostructures and functional film from the overlaid image.

6. The method of claim 1, further comprising measuring a size, shape and distribution of nanoparticles that form a functional coating on the nanostructures.

7. The method described in claim 1, wherein the substrate is a conductive substrate, and wherein the plurality of nanostructures form at least one nanostructured sensor, and the method further comprises
providing a potentiostat which applies a pre-determined voltage range and/or frequency range, wherein an AFM tip of the AFM is connected to one pole of the potentiostat and the conductive silicon substrate is connected to the other pole of the potentiostat;
providing a current measurement circuitry;
placing a skin graft/phantom with simulated sweat and optional metabolites in contact with the plurality of nanostructures on the conductive substrate;
measuring electrical conductivity distribution and electrochemical interactions on a surface of individual nanostructures while in contact with the skin graft/phantom to
analyzing conductive nanostructured sensor performance based on the measured electrical conductivity distribution and electrochemical interactions.

8. The method of claim 1 wherein the substrate is a conductive substrate, and the method further comprises
providing a potentiostat which applies a pre-determined voltage range and/or frequency range, wherein an AFM tip of the AFM is connected to one pole of the potentiostat and the conductive silicon substrate is connected to the other pole of the potentiostat;
providing a current measurement circuitry;
submerging the nanostructures on the conductive substrate and AFM tip in a liquid medium;
measuring electrochemical interactions to analyze chemical interaction between nanostructured fiber surface and the liquid medium.

9. The method of claim 1, wherein each of the plurality of nanostructures include a nanometer scale pillar on a micrometer scale stock.

10. The method of claim 1, wherein the excising is performed with a focused high energy electron/ion beam.

11. A SEM/AFM apparatus comprising:
a tip/tilt kinematic platform including a detachable perfectly smooth platform for accommodating at least 2 samples with at least one of them being a smooth substrate, stilts that move up and down with nanometer precision using a first motor, stilts that move laterally with nanometer precision using a second motor;
software controlling movement of the stepper motors with a SEM image feedback loop
a precision suction probe including a micro suction nozzle, third, fourth and fifth motors for controlling pitch, yaw and roll of the micro suction nozzle, and further motors for extending micro suction nozzle and moving it sideways along one edge of the tip/tilt kinematic platform, a miniature vacuum pump, and electronically controlled valve to control vacuum suction
a controller for controlling movement of the stepper motors with a SEM image feedback loop.

12. Apparatus described in claim 11, further comprising an SEM and an AFM, wherein the tip/tilt kinematic platform and precision suction probe accommodate unobtrusively movement and operation of focused ion beam setup of SEM for focused ion beam assisted ablation and metal deposition.

13. Apparatus described in claim 11, further comprising an SEM and an AFM, wherein the tip/tilt platform is located in the SEM, wherein the detachable smooth platform is mountable on AFM stage of the AFM with accurate height and tilt alignment to allow for an AFM scan coordinated to match with that of SEM scan coordinates generated from an SEM scan of the tip/tilt platform.

14. Apparatus described in claim 13, wherein an AFM tip is used for modification of nanostructure by adding or removing material, and manipulation of nanostructures.

15. Apparatus described in claim 14, wherein the AFM tip is used for characterization if the top surface of vertically standing soft nanostructures for roughness and surface contact properties.

16. A method for of characterizing nanostructured surfaces comprises,
placing a nanostructure sample in an SEM chamber and imaging the sample;
for each of a plurality of vertically standing nanostructures in the sample:
locating one of the nanostructures in the sample using images from the SEM imaging,
excising a top portion of the one of the nanostructures,
placing said top portion on a substrate such that the vertically standing nanostructures are perpendicular to the substrate and a base of the top portion contacts the substrate,
performing high energy ion beam assisted deposition of metal at the base to attach the top portion to the substrate;
SEM imaging the top portions in the SEM chamber,
determining coordinates of the top portions relative to the substrate from the SEM imaging of the top portions,
placing the substrate in an AFM chamber, and
performing AFM imaging of the top portions using the coordinates previously determined.

\* \* \* \* \*